United States Patent [19]
Saw et al.

[11] Patent Number: 5,668,431
[45] Date of Patent: Sep. 16, 1997

[54] SURFACE WAVE DEVICES FOR DIFFERENTIAL COHERENT DETECTORS

[75] Inventors: John Choo-Beng Saw, Kanata; Harry Leib, Montreal; George Alfred Kipens, Ottawa, all of Canada

[73] Assignee: Northern Telecom Limited, Montreal, Canada

[21] Appl. No.: 612,471

[22] Filed: Mar. 7, 1996

[51] Int. Cl.$^6$ ............................................. H03H 9/72
[52] U.S. Cl. ................................. 310/313 R; 310/313 B
[58] Field of Search ............................ 310/313 R, 313 B

[56] References Cited

U.S. PATENT DOCUMENTS

| | | | |
|---|---|---|---|
| 3,810,257 | 5/1974 | Jines et al. | 310/313 R |
| 3,855,548 | 12/1974 | Namdi et al. | 310/313 R |
| 3,961,290 | 6/1976 | Moore | 310/313 R |
| 4,096,477 | 6/1978 | Epstein et al. | 333/30 R |
| 4,169,286 | 9/1979 | Uzunoglu et al. | 310/313 R |
| 4,620,191 | 10/1986 | Skeir | 310/313 B |
| 5,051,709 | 9/1991 | Birkett et al. | 333/28 R |
| 5,056,055 | 10/1991 | Shinonaga | 364/821 |
| 5,365,138 | 11/1994 | Saw et al. | 310/313 D |

OTHER PUBLICATIONS

"Communication Signaling—An Antimultipath Technique", G.L. Turi, IEEE Journal on Selected Areas in Communications, vol. SAC–2, No. 4, Jul. 84, pp. 548–562.

"A Digital Transmission Approach for Indoor Millimeter Waveband Systems", H. Lieb, Proc. of 2nd International Conference on Universal Personal Communications, Oct. 12–15, 1993, Ottawa, Ontario, Canada, pp. 880–884.

"One Chip Demodulator Using RF Front–End SAW Correlator for 2.4 GHz Asynchronous Spread Spectrum Modem", H. Nakase et al, Proc. of 5th IEEE International Symposium on Personal, Indoor, Mobile Radio Communications, The Hague, Netherlands, Sep. 94, pp. 374–378.

*Primary Examiner*—Thomas M. Dougherty
*Attorney, Agent, or Firm*—R. John Haley

[57] ABSTRACT

A surface wave device, for use in differential coherent detection in a commutation signaling communications system using N predetermined M-bit codewords, propagates surface waves for each codeword to a first coded output IDT (inter-digital transducer) comprising M parallel taps with a pitch t=T/M, the taps having phases representing bits of the respective codeword, and to a second output IDT which is at a distance from an input IDT greater by T than the first coded output IDT, to provide an additional delay of one information symbol. The input IDT, or each tap of each coded output IDT, has a length equal to t. The second output IDT can comprise a coded IDT, or a delay tap responsive to the surface wave propagated via the first coded output IDT.

18 Claims, 3 Drawing Sheets

SURFACE WAVE DEVICES FOR DIFFERENTIAL COHERENT DETECTORS

This invention relates to surface wave devices, for use in differential coherent detectors of communications systems using commutation signaling. The term "surface wave" is used herein to embrace all forms of surface acoustic waves (SAWs), including leaky SAWs, and surface skimming bulk waves.

BACKGROUND OF THE INVENTION

Commutation signaling is known for example from an article by George L. Turin entitled "Commutation Signaling—An Antimultipath Technique", IEEE Journal on Selected Areas in Communications, Vol. SAC-2, No. 4, pages 548–562, July 1984. Commutation signaling using differential encoding is particularly advantageous for high speed digital transmission over multipath fading channels. Information to be transmitted is differentially encoded, for example using DPSK (differential phase shift keying), and multiplied by sequential ones of a set of substantially orthogonal codewords; thus commutation signaling is a spectrum spreading technique. An M×N commutation signaling scheme uses N codewords each of M bits. A receiver structure for use in a communications system using such commutation signaling is shown in FIG. 8(c) of that article, and forms the basis for the prior art in FIG. 1 described below.

An article by Harry Leib entitled "A Digital Transmission Approach For Indoor Millimeter Waveband Systems", Proceedings of the 2nd International Conference on Universal Personal Communications, Ottawa, Ontario, Canada, pages 880–884, Oct. 12–15, 1993, suggests the application of SAW devices to a receiver, including matched filters, in such a system, but does not provide details.

An article by H. Nakase et at. entitled "One Chip Demodulator Using RF Front-End SAW Correlator For 2.4 GHz Asynchronous Spread Spectrum Modem", in the Proceedings of the 5th IEEE International Symposium on Personal, Indoor, Mobile Radio Communications, The Hague, The Netherlands, pages 374–378, September 1994 describes a SAW correlator in which a signal spread by a PN (pseudo-noise) code is propagated as a SAW to a tapped delay line with taps matched in phase to the PN code. This article also illustrates a SAW delay line used for differential decoding. This article does not relate to commutation signaling.

Similarly, Shinonaga U.S. Pat. No. 5,056,055 issued Oct. 8, 1991 and entitled "Coherent Surface Acoustic Wave Unique Word Detector" discloses a SAW matched filter having an output IDT (inter-digital transducer) which is coded, i.e. taps along the length of which are matched in phase, in accordance with the bits of the unique word to be detected.

An object of this invention is to provide a practical and advantageous surface wave device for use in differential coherent detectors of communications systems such as those using commutation signaling.

SUMMARY OF THE INVENTION

According to this invention there is provided a surface wave device, for use in a differential coherent detector of a communications system in which differentially encoded information is communicated using at least one predetermined codeword comprising a plurality of M bits, the surface wave device comprising: at least one input IDT (inter-digital transducer), responsive to an input signal comprising information symbols having a predetermined symbol rate, for propagating a surface wave with a predetermined velocity, the predetermined symbol rate and velocity determining a surface wave propagation distance T corresponding to a duration of one information symbol; a first coded output IDT responsive to the propagated surface wave and comprising M taps connected in parallel with one another, the taps having a center-to-center pitch t, in the direction of propagation of the surface wave, equal to T/M, and having phases corresponding to the respective bits of the predetermined codeword; and a second output IDT responsive to a propagated surface wave which is responsive to the input signal and has a propagation distance which is greater by T than a propagation distance of the surface wave propagated from said at least one input IDT to said first coded output IDT.

Preferably said at least one input IDT, or each tap of the first coded output IDT, has a length, in the direction of propagation of the surface wave, equal to t.

The second output IDT can also comprise a coded IDT comprising M taps connected in parallel with one another, the taps having a center-to-center pitch t, in the direction of propagation of the surface wave, and having phases corresponding to the respective bits of the predetermined codeword. A second input IDT can be connected in parallel with said at least one input IDT and arranged to propagate said surface wave to which the second output IDT is responsive, or the second output IDT can be arranged to be responsive to said surface wave propagated by said at least one input IDT via the first coded output IDT.

The invention also provides a surface wave device, for use in a differential coherent detector of a communications system using commutation signaling in which differentially encoded information is communicated using a plurality of N predetermined codewords each comprising a plurality of M bits, the surface wave device comprising: at least one input IDT (inter-digital transducer), responsive to an input signal comprising information symbols having a predetermined symbol rate, for propagating a surface wave with a predetermined velocity, the predetermined symbol rate and velocity determining a surface wave propagation distance T corresponding to a duration of one information symbol; and, for each of the N codewords: a first coded output IDT, responsive to a propagated surface wave which is responsive to the input signal, comprising M taps connected in parallel with one another, the taps having a center-to-center pitch t, in the direction of propagation of the surface wave, equal to T/M, and having phases corresponding to the respective bits of a respective one of the N predetermined codewords; and a second output IDT responsive to a propagated surface wave which is responsive to the input signal and has a propagation distance which is greater by T than a propagation distance of the surface wave propagated from said at least one input IDT to said first coded output IDT.

BRIEF DESCRIPTION OF THE DRAWINGS

The invention will be further understood from the following description with reference to the accompanying drawings, in which.

DETAILED DESCRIPTION

Figure 1:
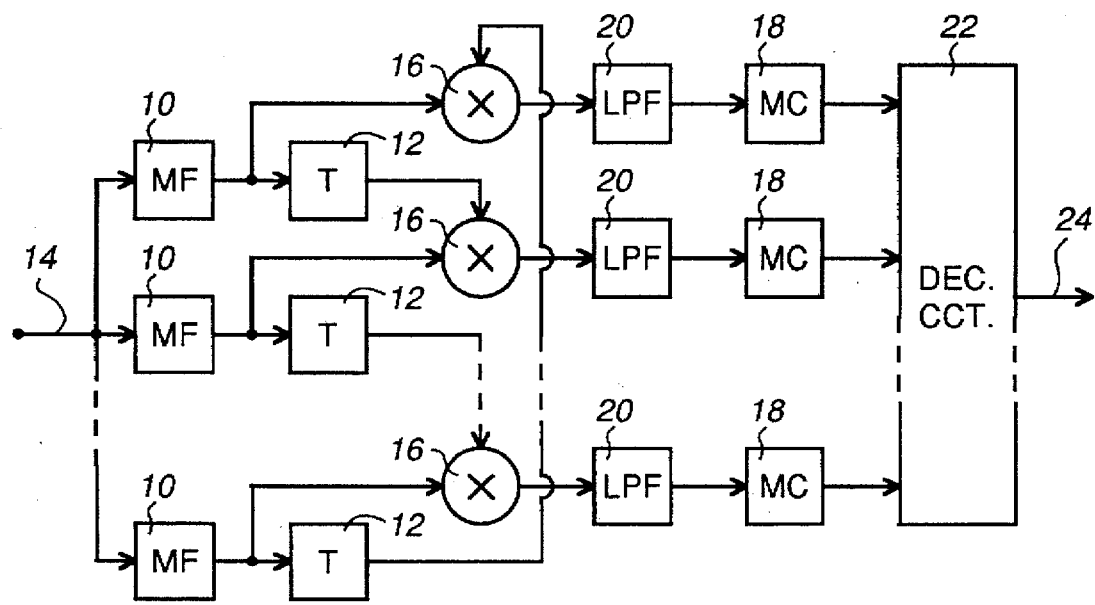
FIG. 1 is a block diagram of a known form of receiver, including differential coherent detectors, for a communications system using commutation signaling.

FIG. 1 illustrates a receiver, known from FIG. 8(c) of the Turin article referred to above, for a communications system using DPSK and M×N commutation signaling, M and N being integers. The receiver comprises N paths, each comprising a matched filter (MF) 10 and a delay unit 12 providing a delay of one symbol period T, to which an input signal on a line 14 is supplied. Each matched filter 10 is matched to a respective one of the N M-bit codewords which are used in sequence by the commutation signaling scheme. The output of each matched filter 10 is multiplied, in a respective one of N multipliers 16, by the output of an adjacent matched filter, delayed by the respective delay unit 12 and corresponding to the respective previous codeword. Outputs of the multipliers 16 are supplied to respective multipath combiners (MC) 18 via respective low-pass filters (LPF) 20, which may alternatively be incorporated into the multipath combiners. Outputs of the multipath combiners 18 are supplied to a commutator and decision circuit (DEC. CCT.) 22 which provides a binary demodulated output signal on a line 24. FIG. 1 illustrates N=3 each of the units 10 to 20, and broken lines indicate that this can be extended to larger numbers of N. Conversely, the arrangement can be reduced for the case of N=2.

The present invention is concerned with implementations using surface wave devices of the pans of the receiver between the input line 14 and the multipliers 16, i.e. the implementation of the functions of the matched filters 10 and the delay lines 12. However, it is observed here that the invention also preferably provides a respective buffer amplifier, not shown, having a low input impedance, in each of the input paths to the multipliers 16. Such buffer amplifiers serve to terminate the surface wave devices with a desirably low impedance. The use of low input impedance buffer amplifiers in the output paths of a SAW device tapped delay line is described in Birkett et al. U.S. Pat. No. 5,051,709 issued Sep. 24, 1991 and entitled "SAW Device Tapped Delay Line And Equalizer", to which further reference is directed in this respect.

In providing such implementations, the embodiments of the invention described below provide either of two modifications of the electrical circuit arrangement of FIG. 1. The modified electrical circuit arrangements are shown in FIGS. 2 and 3 in each case for only one of the N paths, providing in each case from the input signal on the line 14 a relatively undelayed output U and an output D which is delayed relative to the output U by one symbol period T, for supply to respective ones of the multipliers 16 via respective low input impedance buffer amplifiers as described above.

Figure 2:
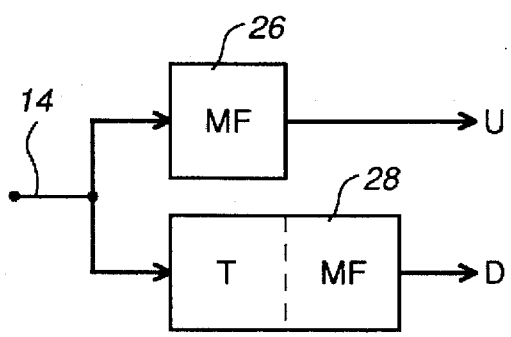
FIGS. 2 and 3 schematically illustrate electrical circuit arrangements of surface wave devices for use in implementing differential coherent detectors in accordance with embodiments of the invention.

In the circuit arrangement of FIG. 2, instead of providing a serial path of a matched filter 10 followed by a delay unit 12 as in FIG. 1, the undelayed output U is provided from a first matched filter 26 constituted by a surface wave device and supplied with the input signal from the line 14, and the delayed output D is provided from a parallel circuit supplied with the input signal from the line 14, this parallel circuit comprising a surface wave device, preferably on the same substrate, providing a symbol period T delay followed by a second matched filter 28. The surface wave devices constituting the matched filters 26 and 28 each comprise an output IDT which is coded in accordance with the respective one of the M-bit codewords. Implementations of the circuit arrangement of FIG. 2 are described below with reference to FIGS. 4 and 5.

Figure 3:
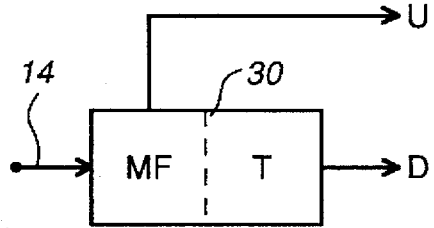

In the circuit arrangement of FIG. 3, a single composite surface wave device 30 is provided which is supplied with the input signal from the line 14. The device 30 includes a matched filter, comprising an output IDT which is coded in accordance with the respective one of the M-bit codewords, which provides the undelayed output U, and a further IDT which provides the delayed output D from continued propagation of the same surface wave through an additional distance, corresponding to the symbol period T. Implementations of the circuit arrangement of FIG. 3 are described below with reference to FIGS. 6 and 7.

Figure 4:
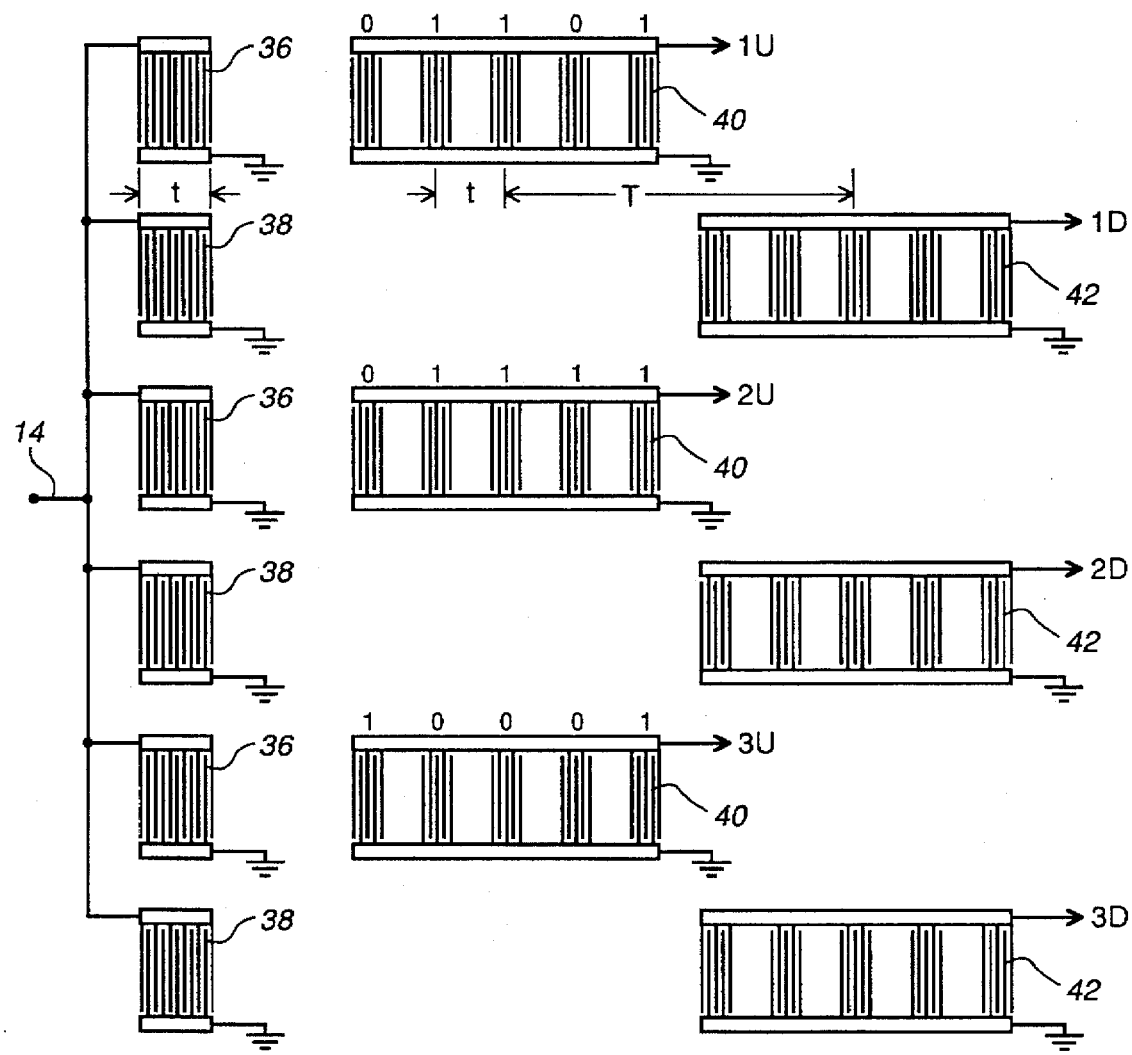
FIG. 4 schematically illustrates a surface wave device arrangement, having surface wave devices with the electrical circuit arrangement of FIG. 2, in accordance with an embodiment of the invention for use in a receiver as shown in FIG. 1.

FIG. 4 illustrates an implementation of the surface wave devices between the input line 14 and the multipliers 16 for a case in which for example N=3 and M=5, the three five-bit codewords being 10110, 11110, and 10001. As shown in FIG. 4, for each of the three codewords there are two input interdigital transducers (IDTs) 36 and 38 each having connection rails connected, in parallel, respectively to the input line 14 and ground, and two coded output IDTs 40 and 42 to which surface waves from the input IDTs 36 and 38 respectively are propagated in accordance with the two parallel paths of the electrical circuit arrangement of FIG. 2. The input IDTs 36 and 38 are all identical to one another, each comprising equal-length (unapodized) fingers extending alternately from the opposite connection rails (each finger can be bifurcated as is well known in the art), the fingers having a metallization ratio of 0.5 and a pitch of $\lambda/2$ in the direction of surface wave propagation where $\lambda$ is the wavelength of the surface wave, and each IDT being a relatively narrowband IDT extending over a length t.

Each coded output IDT 40 comprises M=5 transducer taps which are spaced in the direction of surface wave propagation with a center-to-center pitch of t, the transducer taps being phased in accordance with the respective codeword bits and being connected in parallel. For clarity, the 0 and 1 bits of the codewords are given adjacent to the taps of the IDTs 40, and correspond to the codewords given above. It can be seen in FIG. 4 that each tap of an IDT 40 is a relatively wideband tap in that it comprises relatively few unapodized fingers, which may also be bifurcated as is known in the art, extending between connection rails of the IDT one of which is grounded and the other of which provides an output 1U, 2U, or 3U corresponding to the undelayed output U in FIG. 2. The tap for each 1 bit in the respective codeword has the same phase as the input IDT 36, and the tap for each 0 bit in the respective codeword has the opposite phase; thus as can be seen from FIG. 4 the fingers of the 0-bit taps are inverted relative to the fingers of the 1-bit taps.

Thus each input IDT 36 and its associated coded output IDT 40 in FIG. 4 together form the matched filter 26 as shown in FIG. 2 for a respective one of the three codewords. Correspondingly, each input IDT 38 and its associated coded output IDT 42 together form the delay and matched filter 28 as shown in FIG. 2 for a respective codeword. To this end, for each of the three codewords the IDT 42 is identical to the IDT 40, except in that it is aligned to receive a surface wave propagated from the input IDT 38 and is displaced further from this input IDT by a distance T. The distance T in FIGS. 4 to 7 corresponds to the duration T of one information symbol; i.e. this is equal to the predetermined surface wave propagation velocity divided by the input signal information symbol rate. It can be appreciated that the distance t=T/M, so that in this example of M=5 bits in each codeword, the distance T=5t. The output IDTs 42 provide relatively delayed outputs 1D, 2D, and 3D for the three codewords from their non-grounded connection rails, corresponding to the output D in the equivalent circuit arrangement of FIG. 2.

It is convenient to provide all of the IDTs 36 and 38 on a single substrate, but this need not necessarily be the case, and different combinations of IDT pairs (input and output IDTs) on respective substrates can be provided to suit particular needs or desires. In addition, it is observed that although as described here the input and output IDTs are unbalanced with respect to ground, i.e. one connection rail of each IDT is grounded and the other provides a signal connection, the input IDTs and/or the taps of the output IDTs could instead be arranged to provide balanced or differential connections by changing the phase of half of the fingers, in a similar manner to that described in Saw et al. U.S. Pat. No. 5,365,138 issued Nov. 15, 1994 and entitled "Double Mode Surface Wave Resonators". Similar comments and variations also apply in respect of the other embodiments of the invention described below.

Figure 5:
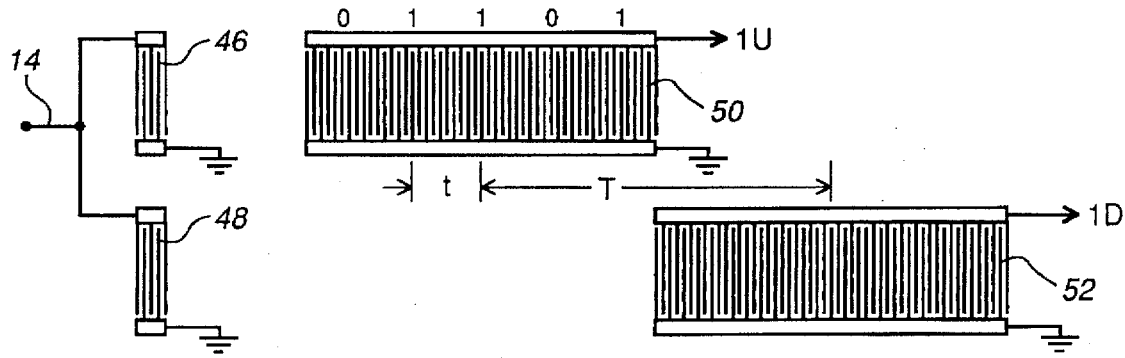
FIGS. 5 to 7 schematically illustrate alternative surface wave device arrangements in accordance with other embodiments of the invention.
Figure 6:
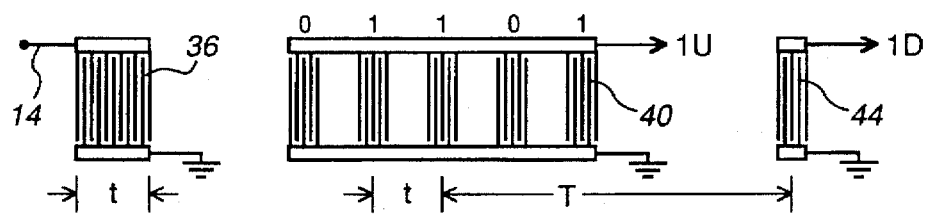
Figure 7:
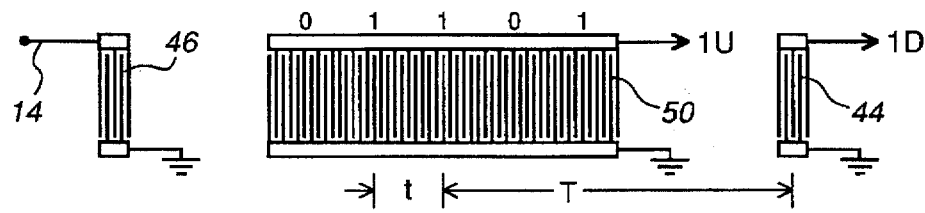

For simplicity each of FIGS. 5 to 7 illustrates an alternative arrangement of the surface wave device for only one of the three codewords, namely the codeword 10110 corresponding to the uppermost IDTs 36 to 42 shown in FIG. 4, and it should be understood that corresponding changes can be made in a similar manner for the IDTs provided in respect of the other codewords.

FIG. 5 illustrates an arrangement which is similar to that of FIG. 4, except that the narrowband and wideband natures of the input and output IDTs are reversed. Thus in the arrangement of FIG. 5 there are two wideband input IDTs 46 and 48 instead of the narrowband input IDTs 36 and 38 respectively of FIG. 6. Conversely, in the arrangement of FIG. 5 there are two coded output IDTs 50 and 52 (which are identical except for their positions) each having narrowband taps, instead of the wideband-tapped coded output IDTs 40 and 42 respectively of FIG. 4. In consequence, as can be seen from FIG. 5 the coded output IDTs 50 and 52 have a continuous periodicity of fingers over their lengths in the direction of surface wave propagation, because the taps all have a length and center-to-center pitch of t. It can be seen that consequently each of the coded output IDTs 50 and 52 has a length of T=5t, so that the last finger of the IDT 50 is aligned with the first finger of the IDT 52. Within each of the coded output IDTs 50 and 52 the fingers have phase reversals corresponding to the transitions between 1 and 0 bits of the codeword, in the same manner as described above in relation to FIG. 4. The continuous periodicity of fingers over the lengths of the output IDTs in the arrangement of FIG. 5 may be advantageous in reducing undesired surface wave reflections.

Although in the arrangement of FIG. 4 the input IDTs 36 and 38 are shown and described above as separate IDTs which are identical to one another, and in the arrangement of FIG. 5 the input IDTs 46 and 48 are similarly shown and described, it is observed that they could instead be constituted by a single, common input IDT having an increased aperture (width) to propagate surface waves to both or all of the output IDTs.

FIG. 6 illustrates an implementation of the surface wave devices corresponding to the electrical circuit arrangement of FIG. 3. In this arrangement a single input IDT 36 and a coded output IDT 40 producing the undelayed output 1U are provided in the same manner as in the arrangement of FIG. 4. The delayed output 1D in this arrangement is produced by a wideband delay tap output IDT 44 which follows the IDT 40, in the direction of surface wave propagation, with a center-to-center pitch of the IDTs 40 and 44 of T. FIG. 7 illustrates a corresponding arrangement, except that the narrowband input IDT 36 and the wideband-tapped output IDT 40 of the arrangement of FIG. 6 are replaced in the arrangement of FIG. 7 by the wideband input IDT 46 and narrowband-tapped output IDT 50 as described above with reference to FIG. 5.

In each of the above surface wave devices, there is a convolution of the surface wave propagated by the input IDT with the coded output IDT constituting the matched filtering. In the arrangements of FIGS. 5 and 6, the surface wave resulting from this convolution or filtering is itself propagated through the further distance T to the output IDT 44, which accordingly is implemented simply as a delay tap.

In each of the above arrangements, each narrowband IDT or tap has a length of t and a number of fingers dictated by this distance and the surface wave wavelength $\lambda$. Typically each wideband IDT or tap can have up to about half as many fingers as the narrowband IDT, so that this does not substantially alter the response of the surface wave device as determined by the coded output IDT.

It may be desirable, especially where bifurcated or split fingers are not used, to reduce the number of fingers in each tap of the coded output IDT in order to reduce reflections between the taps, as well as terminating the output IDTs with low input impedance buffers as described above. To this end, the arrangements of FIGS. 4 and 6 may be preferable to those of FIGS. 5 and 7. Where bifurcated fingers are used in the arrangements of FIGS. 4 and 6, a continuous periodicity can be provided in known manner by providing shorted gratings of dummy fingers between the taps of each coded output IDT 40 or 42.

Thus although particular embodiments of the invention have been described in detail, it should be appreciated that these and numerous other modifications, variations, and adaptations may be made without departing from the scope of the invention as defined in the claims.

What is claimed is:

1. A surface wave device, for use in a differential coherent detector of a communications system in which differentially encoded information is communicated using at least one predetermined codeword comprising a plurality of M bits, the surface wave device comprising:

at least one input IDT (inter-digital transducer), responsive to an input signal comprising information symbols having a predetermined symbol rate, for propagating a surface wave with a predetermined velocity, the predetermined symbol rate and velocity determining a surface wave propagation distance T corresponding to a duration of one information symbol;

a first coded output IDT responsive to the propagated surface wave and comprising M taps connected in parallel with one another, the taps having a center-to-center pitch t, in the direction of propagation of the surface wave, equal to T/M, and having phases corresponding to the respective bits of the predetermined codeword; and a second output IDT responsive to a propagated surface wave which is responsive to the input signal and has a propagation distance which is greater by T than a propagation distance of the surface wave propagated from said at least one input IDT to said first coded output IDT.

2. A surface wave device as claimed in claim 1 wherein said at least one input IDT has a length, in the direction of propagation of the surface wave, equal to t.

3. A surface wave device as claimed in claim 1 wherein each tap of the first coded output IDT has a length, in the direction of propagation of the surface wave, equal to t.

4. A surface wave device as claimed in claim 1 wherein the second output IDT comprises a coded IDT comprising M taps connected in parallel with one another, the taps having a center-to-center pitch t, in the direction of propagation of the surface wave, and having phases corresponding to the respective bits of the predetermined codeword.

5. A surface wave device as claimed in claim 4 wherein said at least one input IDT has a length, in the direction of propagation of the surface wave, equal to t.

6. A surface wave device as claimed in claim 4 wherein each tap of at least one of the coded output IDTs has a length, in the direction of propagation of the surface wave, equal to t.

7. A surface wave device as claimed in claim 4 and including a second input IDT connected in parallel with said at least one input IDT and arranged to propagate said surface wave to which the second output IDT is responsive.

8. A surface wave device as claimed in claim 7 wherein each tap of each of the output IDTs has a length, in the direction of propagation of the surface wave, equal to t.

9. A surface wave device as claimed in claim 1 wherein the second output IDT is arranged to be responsive to said surface wave propagated by said at least one input IDT via the first coded output IDT.

10. A surface wave device as claimed in claim 9 wherein said at least one input IDT has a length, in the direction of propagation of the surface wave, equal to t.

11. A surface wave device as claimed in claim 9 wherein each tap of the first coded output IDT has a length, in the direction of propagation of the surface wave, equal to t.

12. A surface wave device, for use in a differential coherent detector of a communications system using commutation signaling in which differentially encoded information is communicated using a plurality of N predetermined codewords each comprising a plurality of M bits, the surface wave device comprising:

at least one input IDT (inter-digital transducer), responsive to an input signal comprising information symbols having a predetermined symbol rate, for propagating a surface wave with a predetermined velocity, the predetermined symbol rate and velocity determining a surface wave propagation distance T corresponding to a duration of one information symbol; and, for each of the N codewords:

a first coded output IDT, responsive to a propagated surface wave which is responsive to the input signal, comprising M taps connected in parallel with one another, the taps having a center-to-center pitch t, in the direction of propagation of the surface wave, equal to T/M, and having phases corresponding to the respective bits of a respective one of the N predetermined codewords; and a second output IDT responsive to a propagated surface wave which is responsive to the input signal and has a propagation distance which is greater by T than a propagation distance of the surface wave propagated from said at least one input IDT to said first coded output IDT.

13. A surface wave device as claimed in claim 12 wherein said at least one input IDT has a length, in the direction of propagation of the surface wave, equal to t.

14. A surface wave device as claimed in claim 12 wherein each tap of each first coded output IDT, for each of the N codewords, has a length, in the direction of propagation of the surface wave, equal to t.

15. A surface wave device as claimed in claim 12 wherein, for each of the N codewords, the second output IDT comprises a coded IDT comprising M taps connected in parallel with one another, the taps having a center-to-center pitch t, in the direction of propagation of the surface wave, and having phases corresponding to the respective bits of the respective one of the N predetermined codewords.

16. A surface wave device as claimed in claim 12 wherein, for each of the N codewords, the second output IDT is arranged to be responsive to said surface wave propagated by said at least one input IDT via the first coded output IDT.

17. A surface wave device comprising:

at least one input IDT (inter-digital transducer), responsive to an input signal comprising differentially encoded information symbols having a predetermined symbol rate, each symbol comprising a predetermined codeword comprising a plurality of M bits, for propagating a surface wave with a predetermined velocity, the predetermined symbol rate and velocity determining a surface wave propagation distance T corresponding to a duration of one information symbol;

a first coded output IDT comprising M taps connected in parallel with one another, the taps having a center-to-center pitch t, in the direction of propagation of the surface wave, equal to T/M, and having phases corresponding to the respective bits of the predetermined codeword; and a second coded output IDT comprising M taps connected in parallel with one another, the taps having a center-to-center pitch t, in the direction of propagation of the surface wave, equal to T/M, and having phases corresponding to the respective bits of the predetermined codeword;

the fist and second coded output IDTs being responsive to surface waves propagated from said at least one input IDT through a propagation distance for the second coded output IDT which is greater by T than a propagation distance for the first coded output IDT, for providing a first output signal from the first coded output IDT and a second output signal, delayed by the duration of one information symbol relative to the first output signal, from the second coded output IDT.

18. A surface wave device comprising:

an input IDT (inter-digital transducer), responsive to an input signal comprising differentially encoded information symbols having a predetermined symbol rate, each symbol comprising a predetermined codeword comprising a plurality of M bits, for propagating a surface wave with a predetermined velocity, the predetermined symbol rate and velocity determining a surface wave propagation distance T corresponding to a duration of one information symbol;

a first, coded output IDT comprising M taps connected in parallel with one another, the taps having a center-to-center pitch t, in the direction of propagation of the surface wave, equal to T/M, and having phases corresponding to the respective bits of the predetermined codeword responsive to the surface wave propagated from the input IDT to provide a first output signal; and a second, uncoded output IDT arranged to be responsive to the surface wave propagated by the input IDT via the first, coded output IDT, the second, uncoded output IDT having a center-to-center distance from the first, coded output IDT of T whereby the second, uncoded output IDT provides a second output signal delayed by the duration of one information symbol relative to the first output signal.

* * * * *